(12) United States Patent
Lee et al.

(10) Patent No.: US 12,738,925 B2
(45) Date of Patent: Sep. 15, 2026

(54) SURFACE ACOUSTIC WAVE FILTER CONFIGURED TO SUPPRESS SPURIOUS COMPONENTS CAUSED BY TRANSVERSE MODE

(71) Applicant: WISOL CO., LTD., Osan-si (KR)

(72) Inventors: Hun Yong Lee, Osan-si (KR); Sang Hoon Myeong, Osan-si (KR)

(73) Assignee: WISOL CO., LTD., Osan-si (KR)

( * ) Notice: Subject to any disclaimer, the term of this patent is extended or adjusted under 35 U.S.C. 154(b) by 142 days.

(21) Appl. No.: 18/805,761

(22) Filed: Aug. 15, 2024

(65) Prior Publication Data

US 2025/0070755 A1 Feb. 27, 2025

(30) Foreign Application Priority Data

Aug. 24, 2023 (KR) ........................ 10-2023-0111163

(51) Int. Cl.
*H03H 9/64* (2006.01)
*H03H 9/02* (2006.01)

(52) U.S. Cl.
CPC ...... *H03H 9/6489* (2013.01); *H03H 9/02992* (2013.01)

(58) Field of Classification Search
CPC ......................... H03H 9/6489; H03H 9/02992
See application file for complete search history.

(56) References Cited

U.S. PATENT DOCUMENTS

2013/0051588 A1* 2/2013 Ruile ................... H03H 9/1457 29/25.35
2022/0286106 A1* 9/2022 Pernpeintner ...... H03H 9/14532
2023/0077266 A1* 3/2023 Ishitaki .............. H03H 9/02881
2023/0223917 A1* 7/2023 Goto .................. H03H 9/02614 333/193

FOREIGN PATENT DOCUMENTS

JP 2007068107 3/2007
KR 10-2020-0026304 3/2020

* cited by examiner

*Primary Examiner* — Samuel S Outten

(57) ABSTRACT

The present disclosure relates to: a surface acoustic wave filter comprising: a substrate on which a support substrate, an energy confinement layer, and a piezoelectric layer are sequentially stacked; a first bus bar and a second bus bar each extending on the substrate in a first direction and spaced apart from each other in a second direction perpendicular to the first direction; a plurality of first interdigital transducer (IDT) electrodes and a plurality of second IDT electrodes alternately disposed to extend from the first and second bus bars in the second direction and spaced apart from each other in the first direction; a second dummy electrode extending from the second bus bar to face an end portion of each of the plurality of first IDT electrodes extending from the first bus bar; and a first dummy electrode extending from the first bus bar to face an end portion of each of the plurality of second IDT electrodes extending from the second bus bar, wherein an acoustic velocity at the first and second dummy electrodes is higher than an acoustic velocity at the plurality of first and second IDT electrodes.

10 Claims, 11 Drawing Sheets

[a]

EXPERIMENT CONDITION : IDT ELECTRODE WIDTH OF 0.65 ㎛,
DUMMY ELECTRODE WIDTH OF 0.65 ㎛ -> RED GRAPH, DUMMY ELECTRODE WIDTH OF 0.55 ㎛ -> BLUE GRAPH DIFFERENCE OF 0.1 ㎛, REDUCTION RATE OF 15 %

[b]

EXPERIMENT CONDITION : IDT ELECTRODE WIDTH OF 0.65 ㎛,

DUMMY ELECTRODE WIDTH OF 0.65 ㎛ -> RED GRAPH, DUMMY ELECTRODE WIDTH OF 0.50 ㎛

-> BLUE GRAPH DIFFERENCE OF 0.15 ㎛, REDUCTION RATE OF 23 %

[c]

EXPERIMENT CONDITION : IDT ELECTRODE WIDTH OF 0.65 ㎛,
DUMMY ELECTRODE WIDTH OF 0.65 ㎛ -> RED GRAPH, DUMMY ELECTRODE WIDTH OF 0.45 ㎛
-> BLUE GRAPH DIFFERENCE OF 0.20 ㎛, REDUCTION RATE OF 30 %

[d]

EXPERIMENT CONDITION : IDT ELECTRODE WIDTH OF 0.65 ㎛,

DUMMY ELECTRODE WIDTH OF 0.65 ㎛ -> RED GRAPH, DUMMY ELECTRODE WIDTH OF 0.40 ㎛ -> BLUE GRAPH DIFFERENCE OF 0.25 ㎛, REDUCTION RATE OF 38 %

[e]

EXPERIMENT CONDITION : IDT ELECTRODE WIDTH OF 0.65 ㎛,

DUMMY ELECTRODE WIDTH OF 0.65 ㎛ -> RED GRAPH, DUMMY ELECTRODE WIDTH OF 0.35 ㎛

-> BLUE GRAPH DIFFERENCE OF 0.30 ㎛, REDUCTION RATE OF 46 %

[f]

EXPERIMENT CONDITION : IDT ELECTRODE WIDTH OF 0.65 ㎛,

DUMMY ELECTRODE WIDTH OF 0.65 ㎛ -> RED GRAPH, DUMMY ELECTRODE WIDTH OF 0.25 ㎛

-> BLUE GRAPH DIFFERENCE OF 0.40 ㎛, REDUCTION RATE OF 61 %

[g]

EXPERIMENT CONDITION : IDT ELECTRODE WIDTH OF 0.65 ㎛,
DUMMY ELECTRODE WIDTH OF 0.65 ㎛ -> RED GRAPH, DUMMY ELECTRODE WIDTH OF 0.20 ㎛
-> BLUE GRAPH DIFFERENCE OF 0.45 ㎛, REDUCTION RATE OF 69 %

SURFACE ACOUSTIC WAVE FILTER CONFIGURED TO SUPPRESS SPURIOUS COMPONENTS CAUSED BY TRANSVERSE MODE

BACKGROUND OF THE INVENTION

Field of the Invention

The present disclosure relates to a surface acoustic wave filter configured to suppress spurious components caused by a transverse mode, and more particularly, to a surface acoustic wave filter capable of suppressing spurious components caused by an unnecessary transverse mode in a band of frequencies higher than an anti-resonance frequency or a resonance frequency by having an acoustic velocity at a dummy electrode higher than an acoustic velocity at an interdigital transducer (IDT) electrode.

Background of the Related Art

A surface acoustic wave (SAW) refers to a wave that propagates along a surface of an elastic solid. The surface acoustic wave propagates as energy is concentrated near a surface, and corresponds to a mechanical wave. A surface acoustic wave device is an electromechanical device that utilizes an interaction between surface acoustic waves and semiconductor conduction electrons, and use surface acoustic waves transferred to a surface of a piezoelectric crystal. The surface acoustic wave device may have a very wide range of industrial applications including sensors, oscillators, filters, etc., be miniaturized and lightweighted, and may also have various advantages such as robustness, stability, sensitivity, a low cost, real-time property, etc.

However, since spurious components may be generated and an insertion loss may be increased due to an unnecessary transverse mode in the surface acoustic wave filter, performance may deteriorate. A method of reducing a traveling speed of a surface acoustic wave by providing an edge portion having a low acoustic velocity at an interdigital transducer (IDT) electrode has been proposed to reduce the transverse mode.

An example of such a surface acoustic wave filter is disclosed in Patent Document 1 (WO 2021/241117, PCT/JP 2021/016978). This surface acoustic wave filter suppresses spurious components caused by a transverse mode as described below.

FIG. 1 is a plan view of a surface acoustic wave filter 100 disclosed in Patent Document 1.

Referring to FIG. 1, the surface acoustic wave filter 100 includes a substrate 110 on which a support substrate, an energy confinement layer, and a piezoelectric layer are sequentially stacked, and a first bus bar 120 and a second bus bar 125 each extending on the substrate 110 in a first direction and being apart from each other in a second direction perpendicular to the first direction.

Then, a plurality of first interdigital transducer (IDT) electrodes 130 and a plurality of second IDT electrodes 135 are alternately disposed to extend from the first bus bar 120 and the second bus bar 125 in the second direction, and spaced apart from each other in the first direction. In addition, a second dummy electrode 155 and a first dummy electrode 150 are disposed, wherein the second dummy electrode 155 extends from the second bus bar 125 to face an end portion each of the first IDT electrodes 130 extending from the first bus bar 120, and the first dummy electrode 150 extends from the first bus bar 120 to face an end portion of the second IDT electrodes 135 extending from the second bus bar 125.

Particularly, in a region C in which the first IDT electrodes 130 and the second IDT electrodes 135 are present together in the second direction and spaced apart from each other in the first direction, an edge portion having an acoustic velocity lower than that in a center portion is disposed at both ends of the center portion.

Referring to regions indicated on a left side of FIG. 1, a region corresponding to C2 or C3 represents the edge portion, a region corresponding to C1 represents the center portion, and an acoustic velocity in the region corresponding to C2 or C3 is configured to be lower than that in the region corresponding to C1.

Like shapes of the first IDT electrodes 130 and the second IDT electrodes 135 each shown in FIG. 1, a width of electrodes in edge portions (C2 and C3) is configured to be greater than a width of electrodes in the center portion (C1) to constitute a region with a low acoustic velocity.

A graph shown on a right side of FIG. 1 represents an acoustic velocity in each portion. An acoustic velocity in the edge portions C2 and C3 is V2 and an acoustic velocity in the center portion C1 is V3. In this case, V3>V2.

That is, the first and second IDT electrodes 130 and 135 include a region C1 (the center portion), and regions C2 and C3 (the edge portions) with an acoustic velocity lower than that in the region C1 (the center portion).

Meanwhile, the applicant of the present disclosure has also developed a surface acoustic wave filter implemented to have a low acoustic velocity region at the edge portions using another method. This is described with reference to FIGS. 2 and 3.

FIG. 2 is a diagram illustrating a surface acoustic wave filter in which a mass addition film 160 is disposed on an electrode. FIG. 3 is a sectional view of a section AA' in the surface acoustic wave filter of FIG. 2.

Referring to FIGS. 2 and 3, the mass addition film 160 is disposed on an upper surface of regions C2 and C3 of an IDT electrode to implement the regions C2 and C3 as low acoustic velocity regions.

At this time, the mass addition film 160 has a density of 5 g/cm$^3$ or less, and includes at least one material selected from silicon dioxide ($SiO_2$), tantalum pentoxide ($Ta_2O_5$), and aluminum oxide ($Al_2O_3$).

As such, it has been understood that the mass addition film 160 is disposed in a section corresponding to a low acoustic velocity region to reduce an acoustic velocity in the low acoustic velocity region from V3 to V2, thereby suppressing spurious components caused by a transverse mode as disclosed in the cited patent document.

However, such technologies described above are all limited to implementing an edge portion as a low acoustic velocity region.

It has been checked that implementation of a low acoustic velocity region has an effect of suppressing spurious components caused by a transverse mode. However, since spurious components are still generated in a band of frequencies higher than an anti-resonance frequency. Thus, this needs to be improved.

PRIOR ART DOCUMENTS

Patent Document (Patent Document 1) International Patent Publication WO 2021/241117, PCT/JP 2021/016978

SUMMARY OF THE INVENTION

Therefore, the present disclosure has been made in view of the above problems, and it is an object of the present disclosure to provide a surface acoustic wave filter configured to suppress spurious components caused by a transverse mode in a band of frequencies higher than an anti-resonance frequency or a resonance frequency.

The technical problems of the present disclosure are not limited to the technical problems mentioned above, and unmentioned other technical problems will be clearly understood by those skilled in the art from the following description.

To accomplish the above object, according to one aspect of the present disclosure, there is provided a surface acoustic wave filter configured to suppress spurious components caused by a transverse mode, the surface acoustic wave filter including: a substrate on which a support substrate, an energy confinement layer, and a piezoelectric layer are sequentially stacked; a first bus bar and a second bus bar each extending on the substrate in a first direction and spaced apart from each other in a second direction perpendicular to the first direction; a plurality of first interdigital transducer (IDT) electrodes and a plurality of second IDT electrodes alternately disposed to extend from the first and second bus bars in the second direction and spaced apart from each other in the first direction; a second dummy electrode extending from the second bus bar to face an end portion of each of the plurality of first IDT electrodes extending from the first bus bar; and a first dummy electrode extending from the first bus bar to face an end portion of each of the plurality of second IDT electrodes extending from the second bus bar, wherein an acoustic velocity at the first and second dummy electrodes is higher than an acoustic velocity at the plurality of first and second IDT electrodes.

To accomplish the above object, according to one aspect of the present disclosure, there is provided a surface acoustic wave filter configured to suppress spurious components caused by a transverse mode, the surface acoustic wave filter including: a substrate on which a support substrate, an energy confinement layer, and a piezoelectric layer are sequentially stacked; a first bus bar and a second bus bar each extending on the substrate in a first direction and spaced apart from each other in a second direction perpendicular to the first direction; a plurality of first interdigital transducer (IDT) electrodes and a plurality of second IDT electrodes alternately disposed to extend from the first and second bus bars in the second direction and spaced apart from each other in the first direction; a second dummy electrode extending from the second bus bar to face an end portion of each of the plurality of first IDT electrodes extending from the first bus bar; and a first dummy electrode extending from the first bus bar to face an end portion of each of the plurality of second IDT electrodes extending from the second bus bar, wherein spurious components are suppressed in a band of frequencies higher than an anti-resonance frequency.

To accomplish the above object, according to one aspect of the present disclosure, there is provided a surface acoustic wave filter configured to suppress spurious components caused by a transverse mode, the surface acoustic wave filter including: a substrate on which a support substrate, an energy confinement layer, and a piezoelectric layer are sequentially stacked; a first bus bar and a second bus bar each extending on the substrate in a first direction and spaced apart from each other in a second direction perpendicular to the first direction; a plurality of first interdigital transducer (IDT) electrodes and a plurality of second IDT electrodes alternately disposed to extend from the first and second bus bars in the second direction and spaced apart from each other in the first direction; a second dummy electrode extending from the second bus bar to face an end portion of each of the plurality of first IDT electrodes extending from the first bus bar; and a first dummy electrode extending from the first bus bar to face an end portion of each of the plurality of second IDT electrodes extending from the second bus bar, wherein spurious components are suppressed in a band of frequencies higher than a resonance frequency.

In some embodiments of the present disclosure, a width of each of the first and second dummy electrodes may be smaller than a width of each of the plurality of first and second IDT electrodes.

In some embodiments of the present disclosure, a width of each of the first and second dummy electrodes may be configured to be in a range between 20% and 80% of a width of each of the plurality of first and second IDT electrodes.

In some embodiments of the present disclosure, a width of each of the first and second dummy electrodes may be configured to be in a range between 50% and 80% of a width of each of the plurality of first and second IDT electrodes.

In some embodiments of the present disclosure, a density of each of the first and second dummy electrodes may be higher than a density of each of the plurality of first and second IDT electrodes.

In some embodiments of the present disclosure, an edge portion with an acoustic velocity lower than an acoustic velocity in a central portion may be disposed on both sides of a region in which the plurality of first IDT electrodes and the plurality of second IDT electrodes are present together in the second direction and spaced apart from each other in the first direction.

In some embodiments of the present disclosure, a width of the edge portion may be greater than a width of each of the plurality of first and second IDT electrodes.

In some embodiments of the present disclosure, a density of the edge portion may be lower than a density of each of the plurality of first and second IDT electrodes.

In some embodiments of the present disclosure, the edge portion may be constituted by adding a mass addition film to the plurality of first and second IDT electrodes.

In some embodiments of the present disclosure, the mass addition film may have a density equal to or less than 5 $g/cm^3$.

In some embodiments of the present disclosure, the mass addition film may include at least one selected from silicon dioxide ($SiO_2$), tantalum pentoxide ($Ta_2O_5$), and aluminum oxide ($Al_2O_3$).

As described above, a surface acoustic wave filter configured to suppress spurious components caused by a transverse mode according to the present disclosure may be configured such that an acoustic velocity at dummy electrodes is higher than an acoustic velocity at IDT electrodes. Thus, spurious components caused by an unnecessary transverse mode may be suppressed in a band of frequencies higher than an anti-resonance frequency or a resonance frequency to thereby enhance characteristics of a high-frequency front-end circuit.

DETAILED DESCRIPTION OF THE PREFERRED EMBODIMENT

Figure 1:
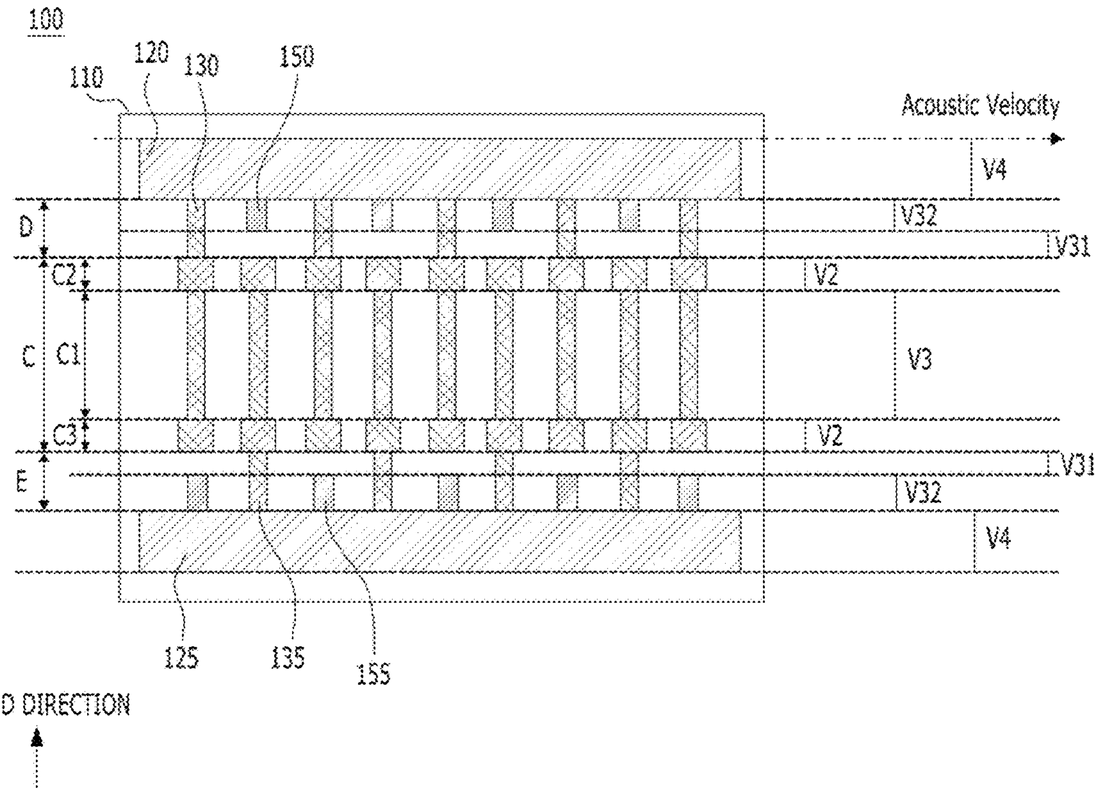
FIG. 1 is a plan view of a surface acoustic wave filter in the related art.
Figure 2:
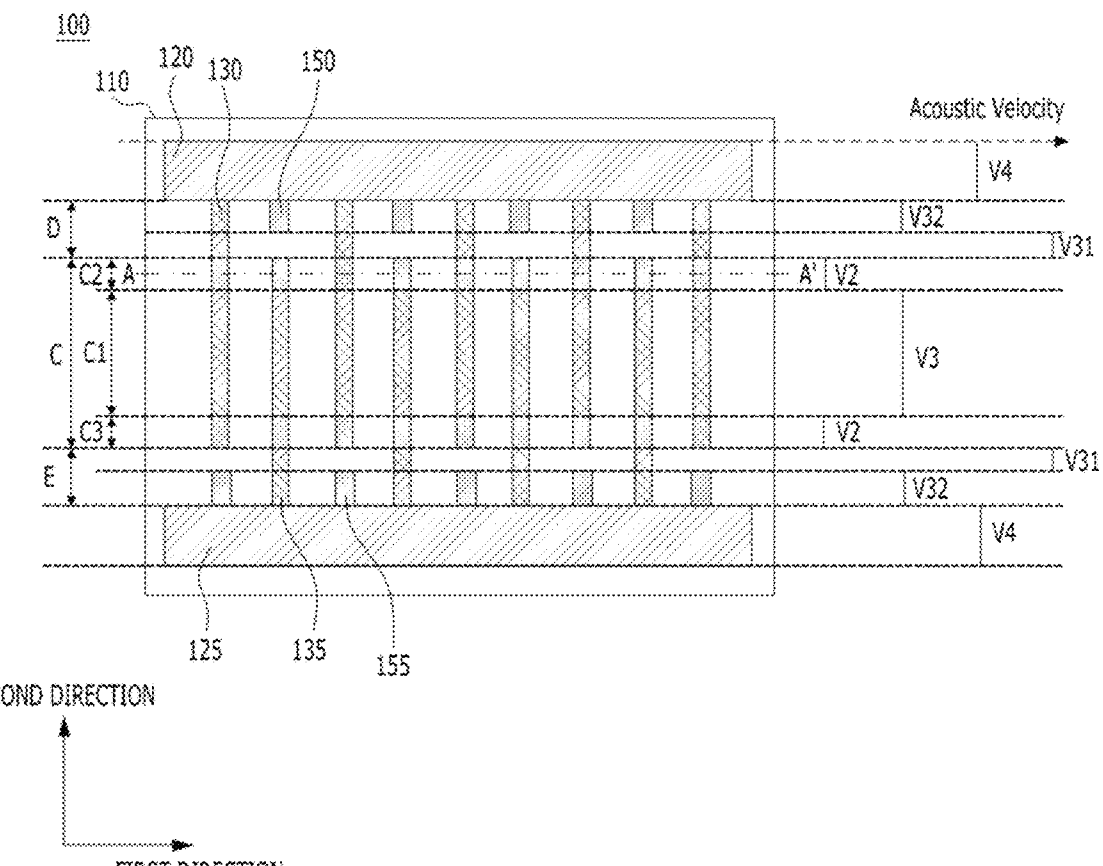
FIG. 2 is a diagram illustrating a surface acoustic wave filter in which a mass addition film is disposed on an electrode.
Figure 3:
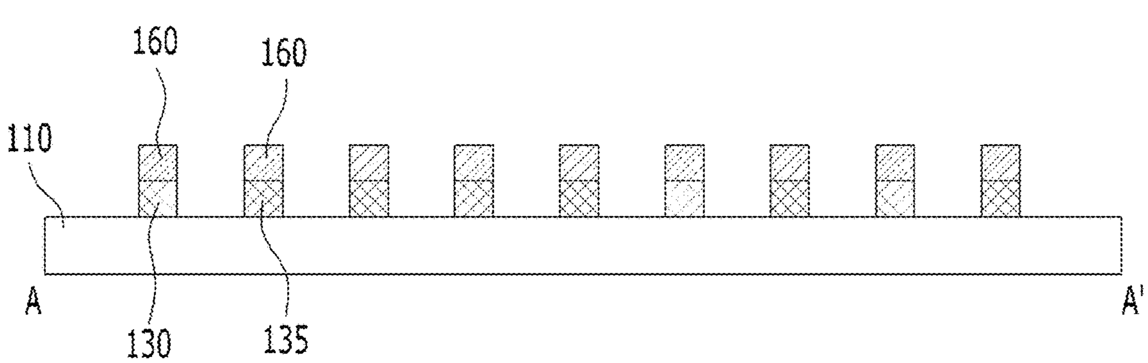
FIG. 3 is a sectional view of a section AA' in the surface acoustic wave filter of FIG. 2.

Advantages and features of the present disclosure and methods of accomplishing the same may be understood more readily with by reference to the following detailed description of embodiments and the accompanying drawings. However, the present disclosure is not limited to the embodiments set forth herein, and may be embodied in many different forms. The embodiments are provided so that this disclosure will be thorough and complete, and will fully convey the concept of the present disclosure to those skilled in the art, and the scope of the present disclosure should be defined by the appended claims. Like reference numerals denote like elements throughout this specification.

The term "and/or" includes each of the mentioned items and all combinations of one or more of the mentioned items.

As used herein, the term is intended to describe the embodiments but is not intended to limit the present disclosure. In this specification, the singular includes the plural unless specifically stated otherwise. It will be further understood that the terms "comprises," "comprising," "includes," and/or "including," when used herein, mean that the mentioned components, steps, operations, and/or elements do not exclude the presence or addition of one or more other components, steps, operations and/or elements.

It will be understood that when an element is referred to as being "connected to" or "coupled to" another element, it may be "directly connected or coupled" to the other element, or "electrically connected to" the other element with intervening elements therebetween.

It will be understood throughout the specification that when a layer (film), region, pattern or structure is referred to as being disposed "over/on" or "below/under" a substrate, another layer (film), region, pad, or pattern, it can be directly or indirectly disposed on the substrate, the other layer (film), region, pad, or pattern with intervening elements therebetween. A reference for being over/on or below/under is to be described based on the drawing.

In addition, the expressions such as 'first, second', etc. are expressions used only to distinguish a plurality of components, and do not limit the order or other features between the components.

In addition, the flowcharts illustrated in the drawings are merely example sequences to obtain most desirable results in implementing the present disclosure, and other steps may be added or some steps may be omitted.

Figure 4:
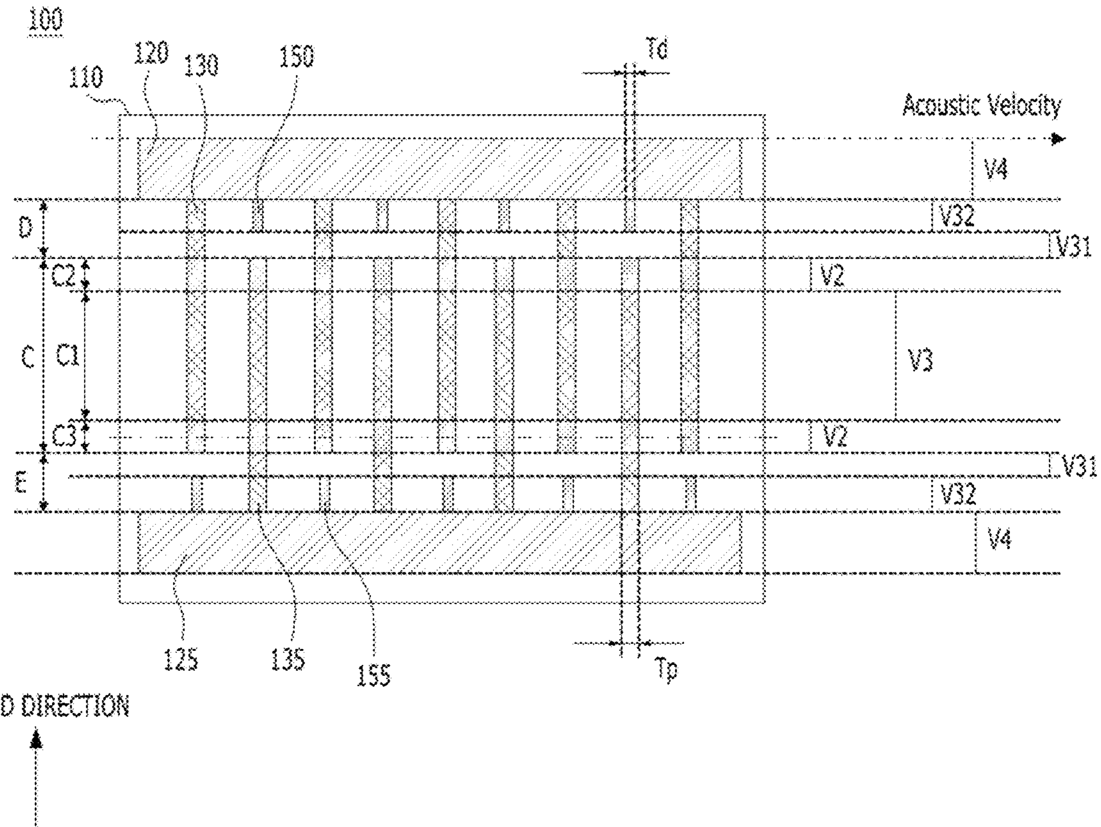
FIG. 4 is a plan view of a surface acoustic wave filter according to an embodiment of the present disclosure.
Figure 5A:
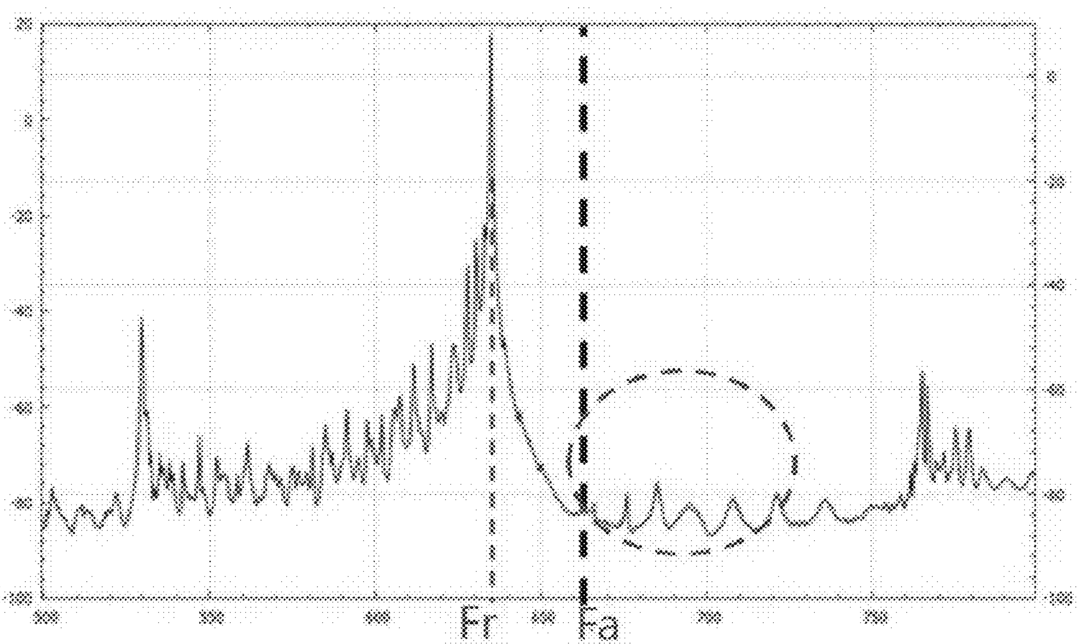
FIGS. 5A to 5G are diagrams for showing an effect of suppressing spurious components in the surface acoustic wave filter according to an embodiment of the present disclosure.
Figure 5B:
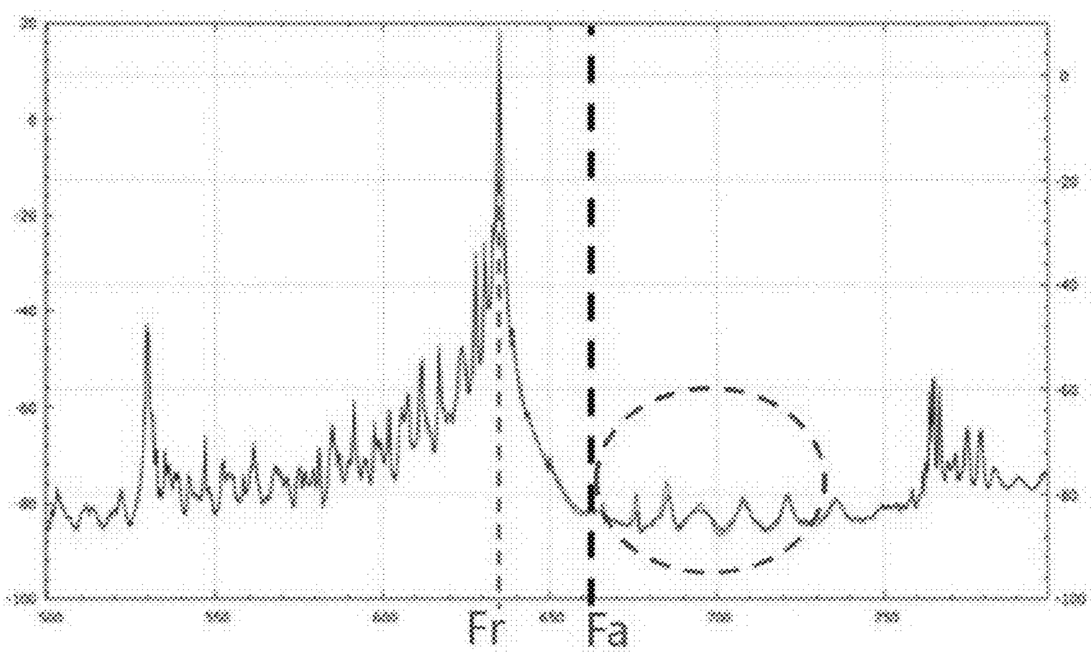
Figure 5C:
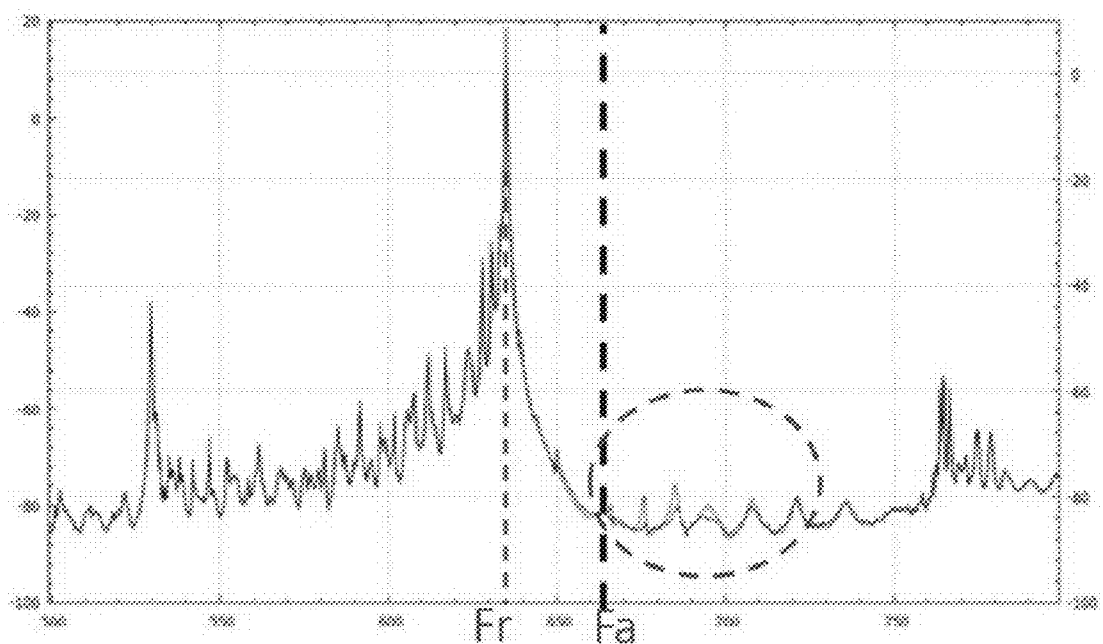
Figure 5D:
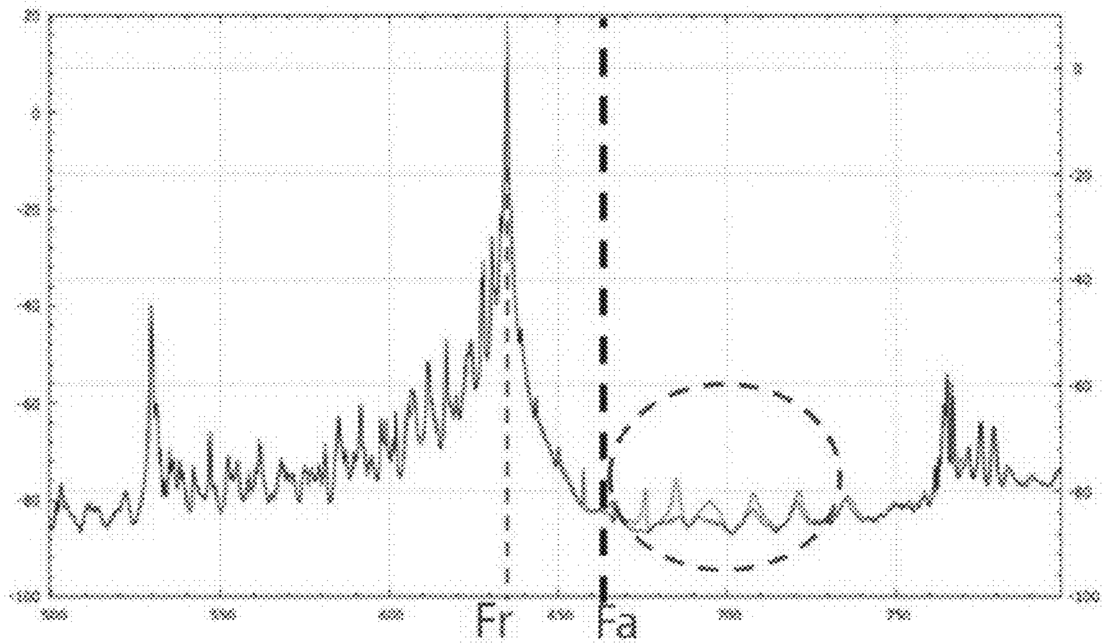
Figure 5E:
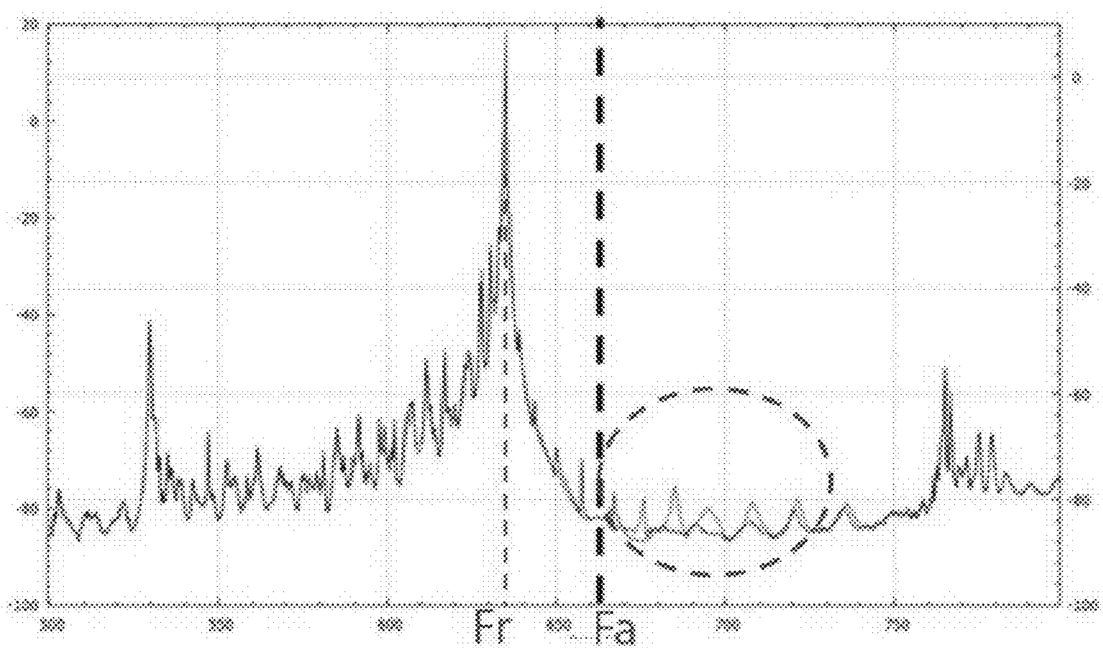
Figure 5F:
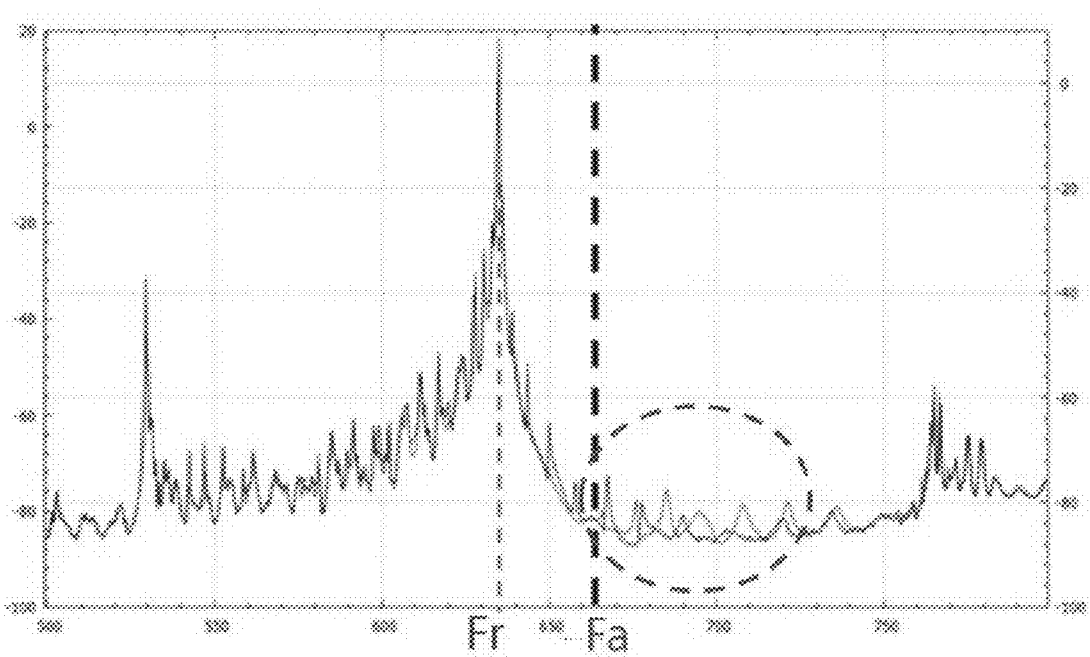
Figure 5G:
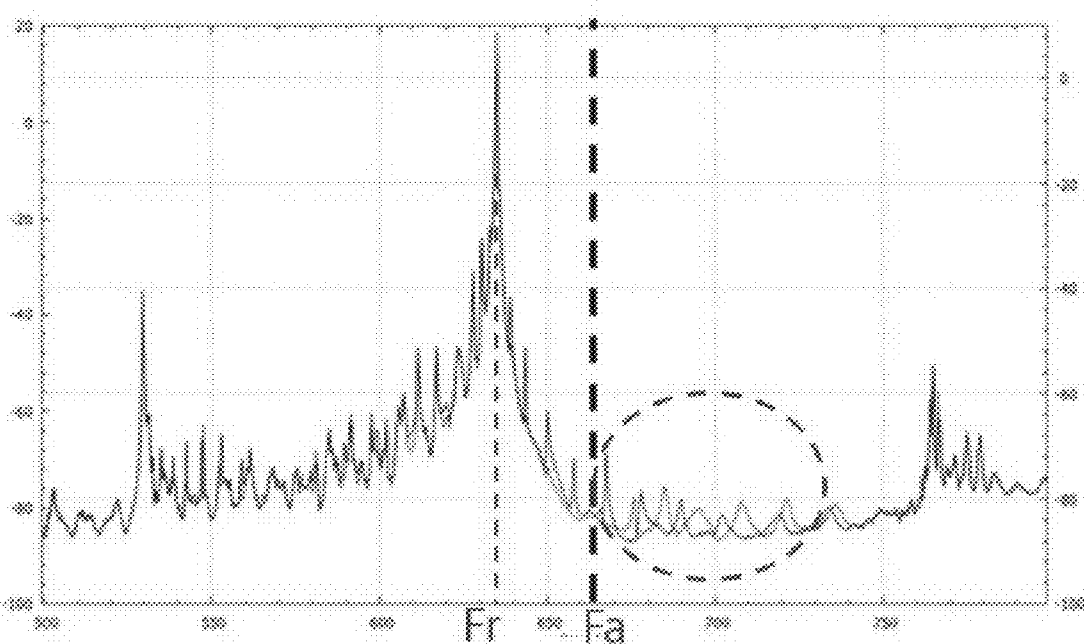

Unless defined otherwise, all the terms (including technical and scientific terms) used in this specification may be used as meanings that can be commonly understood by those skilled in the art. In addition, terms defined in commonly used dictionaries are not interpreted ideally or excessively unless clearly and specially defined. FIG. 4 is a plan view of a surface acoustic wave filter 100 according to an embodiment of the present disclosure.

Referring to FIG. 4, the surface acoustic wave filter 100 includes a substrate 110 on which a support substrate, an energy confinement layer, and a piezoelectric layer are sequentially stacked, and a first bus bar 120 and a second bus bar 125 each extending on the substrate 110 in a first direction and being apart from each other in a second direction perpendicular to the first direction.

Then, a plurality of first interdigital transducer (IDT) electrodes 130 and a plurality of second IDT electrodes 135 are alternately disposed to extend from the first bus bar 120 and the second bus bar 125 in the second direction, and spaced apart from each other in the first direction. In addition, a second dummy electrode 155 and a first dummy electrode 150 are disposed, wherein the second dummy electrode 155 extends from the second bus bar 125 to face an end portion of each of the first IDT electrodes 130 extending from the first bus bar 120, and the first dummy electrode 150 extends from the first bus bar 120 to face an end portion of each of the second IDT electrodes 135 extending from the second bus bar 125.

In a region C in which the first IDT electrodes 130 and the second IDT electrodes 135 are present together in the second direction and spaced apart from each other in the first direction, an edge portion having an acoustic velocity lower than that in a center portion is disposed at both ends of the center portion.

A mass addition film 160 is disposed on upper surfaces of regions corresponding to C2 and C3 in the first and second IDT electrodes 130 and 135 to constitute a low acoustic velocity region.

At this time, the mass addition film 160 has a density of 5 $g/cm^3$ or less, and includes at least one material selected from silicon dioxide ($SiO_2$), tantalum pentoxide ($Ta_2O_5$), and aluminum oxide ($Al_2O_3$).

The mass addition film 160 is added to the edge portion so that an acoustic velocity in the edge portion is lower than an acoustic velocity in the center portion of the first and second IDT electrodes 130 and 135.

A graph shown on a right side of FIG. 4 represents an acoustic velocity in respective portions. An acoustic velocity in the edge portions, i.e., regions C2 and C3 is V2 and an acoustic velocity in the center portion, i.e., a region C1 is V3. In this case, V3>V2.

That is, the first and second IDT electrodes 130 and 135 include the region C1 (the center portion), and the regions C2 and C3 (the edge portions) having an acoustic velocity lower than that in the region C1 (the center portion).

Particularly, the surface acoustic wave filter in the present disclosure has such characteristics that an acoustic velocity at the first and second dummy electrodes 150 and 155 is higher than that in the center portion C1 of the first and second IDT electrodes 130 and 135.

An acoustic velocity at the first and second dummy electrodes 150 and 155 is V32 and an acoustic velocity in the center portion C1 of the first and second IDT electrodes 130 and 135 is V3. In this case, V32>V3.

The first and second dummy electrodes 150 and 155 in the surface acoustic wave filter in the present disclosure may be configured to have a width smaller than that of the center portion C1 of the first and second IDT electrodes 130 and 135 so that an acoustic velocity at the first and second dummy electrodes 150 and 155 is higher than an acoustic velocity in the center portion C1 of the first and second IDT electrodes 130 and 135.

A density of the first and second dummy electrodes 150 and 155 may be configured to be lower than that of the first and second IDT electrodes 130 and 135 to have an acoustic velocity at the first and second dummy electrodes 150 and 155 lower than that in the center portion C1 of the first and second IDT electrodes 130 and 135.

In a surface acoustic wave filter in the related art, a width of dummy electrodes extending from a bus bar in a direction perpendicular to that of acoustic wave propagation is identical to a width of a center portion of IDT electrodes.

Thus, since an acoustic velocity at the dummy electrodes is identical to an acoustic velocity in the center portion of the IDT electrodes, such a phenomenon that spurious components increase in a band of frequencies higher than a resonance frequency due to a region such as a resonance point in the center portion occurs.

It may be checked that, when an acoustic velocity at the dummy electrodes is higher than that in the center portion of the IDT electrodes, spurious components are further suppressed in a band of frequencies higher than the resonance frequency.

FIGS. 5A to 5G are diagrams for showing an effect of suppressing spurious components in the surface acoustic wave filter according to an embodiment of the present disclosure.

FIGS. 5A to 5G show measurement results of experiments performed by manufacturing IDT electrodes and dummy electrodes by fixing a width of the IDT electrodes at 0.65 μm, and changing a width of the dummy electrodes from 0.65 μm, 0.55 μm, 0.50 μm, 0.45 μm, 0.40 μm, 0.35 μm, 0.25 μm, to 0.2 μm.

A red graph line represents a result of measurement performed by manufacturing dummy electrodes to have a width of 0.65 μm which is identical to that of the IDT electrodes, and a blue graph line represents a result of measurement performed by changing a width of the dummy electrodes from 0.55 μmm to 0.2 μm.

In FIGS. 5A to 5G, when a horizontal axis represents a frequency, Fr represents a resonance frequency, and Fa represents an anti-resonance frequency. A vertical axis represents a size of output for each frequency input. An area marked by a dotted circle is a portion in which an effect of suppressing spurious components in a band of frequencies equal to or higher than the anti-resonance frequency may be checked.

The measurement results of the experiments are presented in the table below.

TABLE 1

| | Width of IDT electrode (μm) | Width of dummy electrode (μm) | Difference (μm) | Ratio of dummy electrode to IDT electrode | Spurious component reduction effect (Fa < f) | Spurious component reduction effect (Fr < f < Fa) |
|---|---|---|---|---|---|---|
| Experiment (a) | 0.65 | 0.55 | 0.10 | 85% | None | None |
| Experiment (b) | 0.65 | 0.50 | 0.15 | 77% | medium | None |
| Experiment (c) | 0.65 | 0.45 | 0.20 | 69% | Great | None |
| Experiment (d) | 0.65 | 0.40 | 0.25 | 62% | Great | None |
| Experiment (e) | 0.65 | 0.35 | 0.30 | 54% | Great | None |
| Experiment (f) | 0.65 | 0.25 | 0.40 | 38% | medium | Worse |
| Experiment (g) | 0.65 | 0.20 | 0.45 | 31% | Medium *1) | Worse |

*1) Limited effect: no effect near the anti-resonance frequency, but a great effect in a region of a higher frequency An effect of suppressing spurious components in a band of frequencies equal to or higher the anti-resonance frequency Fa may be checked when a width of the dummy electrodes is configured to be in a range between 20% and 80% of a width of the IDT electrodes.

In this case, when a width of the dummy electrodes is expressed as Td and a width of the IDT electrodes is expressed as Tp, Td and Tp may be expressed as presented in the equation below.

$$(0.2\times Tp)<Td<(0.8\times Tp)$$

However, when a width of the dummy electrodes is 20% to 50% of a width of the IDT electrodes, it may be understood that an effect of suppressing spurious components is present in a band of frequencies higher than the anti-resonance frequency Fa, but suppression of spurious components deteriorates in a band between a resonance frequency Fr and the anti-resonance frequency Fa.

This case may be applied when spurious components need to be selectively reduced in a band of particular frequencies equal to or higher than an anti-resonance frequency in a case of designing a high-frequency circuit. This is because there may be a need to reduce spurious components at such particular frequencies as an input frequency band at a front end of a high-frequency application device becomes increasingly widened recently.

To obtain an effect of improving suppression of spurious components in all bands of frequencies equal to or higher than the resonance frequency Fr, a width of the dummy electrodes may be configured to be in a range between 50% and 80% of a width of the IDT electrodes.

In a section in which a width of the dummy electrodes is in a range between 20% and 50% of a width of the IDT electrodes, suppression of spurious components may be improved in a band of frequencies equal to or higher than the anti-resonance frequency Fa, but may deteriorate at some frequencies in a band between the resonance frequency Fr and the anti-resonance frequency Fa. Thus, such frequencies need to be excluded.

In this case, when a width of the dummy electrodes is expressed as Td and a width of the IDT electrodes is expressed as Tp, a relationship between Td and Tp may be expressed as shown in the equation below.

$$(0.5\times Tp)<Td<(0.8\times Tp)$$

As such, a surface acoustic wave filter configured to suppress spurious components caused by a transverse mode according to the present disclosure may be configured such that an acoustic velocity at dummy electrodes is higher than an acoustic velocity at IDT electrodes. Thus, spurious components caused by an unnecessary transverse mode may be suppressed and an insertion loss may be resolved in a band of frequencies higher than an anti-resonance frequency.

Although the embodiments of the present disclosure have been described above with reference to the accompanying drawings, those skilled in the art may understand that the present disclosure can be implemented in other specific forms without changing the technical spirit or essential features The scope of the present disclosure is to be basically determined by the scope defined by the appended claims, but not only the configurations directly derived from the claims, but also all changes or variations within the scope of the claims and their equivalents are to be construed as being included in the present disclosure.

DESCRIPTION OF SYMBOLS

100: Surface acoustic wave filter
110: Substrate
120: First bus bar
125: Second bus bar
130: First IDT electrode
135: Second IDT electrode
150: First dummy electrode
155: Second dummy electrode
160: Mass addition film

What is claimed is:

1. A surface acoustic wave filter configured to suppress spurious components caused by a transverse mode, the surface acoustic wave filter comprising:
- a substrate on which a support substrate, an energy confinement layer, and a piezoelectric layer are sequentially stacked;
- a first bus bar and a second bus bar each extending on the substrate in a first direction and spaced apart from each other in a second direction perpendicular to the first direction;
- a plurality of first interdigital transducer (IDT) electrodes and a plurality of second IDT electrodes alternately disposed to extend from the first and second bus bars in the second direction and spaced apart from each other in the first direction;
- a second dummy electrode extending from the second bus bar to face an end portion of each of the plurality of first IDT electrodes extending from the first bus bar; and
- a first dummy electrode extending from the first bus bar to face an end portion of each of the plurality of second IDT electrodes extending from the second bus bar,
- wherein an acoustic velocity at the first and second dummy electrodes is higher than an acoustic velocity at the plurality of first and second IDT electrodes; and
- wherein a width of each dummy electrode is between 55% and 70% of a width of a center portion (C1) of each IDT electrode, configured to simultaneously suppress the spurious components within both:
- a first frequency band between a resonance frequency and an anti-resonance frequency (Fr<f<Fa), and
- a second frequency band higher than the anti-resonance frequency (Fa<f).

2. The surface acoustic wave filter according to claim 1, wherein an edge portion with an acoustic velocity lower than an acoustic velocity in a central portion is disposed on both sides of a region in which the plurality of first IDT electrodes and the plurality of second IDT electrodes are present together in the second direction and spaced apart from each other in the first direction.

3. The surface acoustic wave filter according to claim 2, wherein the edge portion is constituted by adding a mass addition film to the plurality of first and second IDT electrodes.

4. The surface acoustic wave filter according to claim 3, wherein the mass addition film has a density equal to or less than 5 g/cm$^3$.

5. The surface acoustic wave filter according to claim 3, wherein the mass addition film comprises at least one selected from silicon dioxide ($SiO_2$), tantalum pentoxide ($Ta_2O_5$), and aluminum oxide ($Al_2O_3$).

6. The surface acoustic wave filter according to claim 2, wherein a width of the edge portion is greater than a width of each of the plurality of first and second IDT electrodes.

7. The surface acoustic wave filter according to claim 2, wherein a density of the edge portion is lower than a density of each of the plurality of first and second IDT electrodes.

8. The surface acoustic wave filter according to claim 1, wherein a density of each of the first and second dummy electrodes is higher than a density of each of the plurality of first and second IDT electrodes.

9. A surface acoustic wave filter configured to suppress spurious components caused by a transverse mode, the surface acoustic wave filter comprising:
- a substrate on which a support substrate, an energy confinement layer, and a piezoelectric layer are sequentially stacked;
- a first bus bar and a second bus bar each extending on the substrate in a first direction and spaced apart from each other in a second direction perpendicular to the first direction;
- a plurality of first interdigital transducer (IDT) electrodes and a plurality of second IDT electrodes alternately disposed to extend from the first and second bus bars in the second direction and spaced apart from each other in the first direction;
- a second dummy electrode extending from the second bus bar to face an end portion of each of the plurality of first IDT electrodes extending from the first bus bar; and
- a first dummy electrode extending from the first bus bar to face an end portion of each of the plurality of second IDT electrodes extending from the second bus bar,
- wherein spurious components are suppressed in a band of frequencies higher than an anti-resonance frequency; and
- wherein a width of each dummy electrode is between 55% and 70% of a width of a center portion (C1) of each IDT electrode, configured to simultaneously suppress the spurious components within both:
- a first frequency band between a resonance frequency and an anti-resonance frequency (Fr<f<Fa), and a second frequency band higher than the anti-resonance frequency (Fa<f).

10. A surface acoustic wave filter configured to suppress spurious components caused by a transverse mode, the surface acoustic wave filter comprising:

a substrate on which a support substrate, an energy confinement layer, and a piezoelectric layer are sequentially stacked;

a first bus bar and a second bus bar each extending on the substrate in a first direction and spaced apart from each other in a second direction perpendicular to the first direction;

a plurality of first interdigital transducer (IDT) electrodes and a plurality of second IDT electrodes alternately disposed to extend from the first and second bus bars in the second direction and spaced apart from each other in the first direction;

a second dummy electrode extending from the second bus bar to face an end portion of each of the plurality of first IDT electrodes extending from the first bus bar; and a first dummy electrode extending from the first bus bar to face an end portion of each of the plurality of second IDT electrodes extending from the second bus bar, wherein spurious components are suppressed in a band of frequencies higher than a resonance frequency; and wherein a width of each dummy electrode is between 55% and 70% of a width of a center portion (C1) of each IDT electrode, configured to simultaneously suppress the spurious components within both:

a first frequency band between a resonance frequency and an anti-resonance frequency (Fr<f<Fa), and a second frequency band higher than the anti-resonance frequency (Fa<f).

* * * * *